United States Patent
Burgyan et al.

(10) Patent No.: US 8,564,092 B2
(45) Date of Patent: Oct. 22, 2013

(54) POWER CONVERTOR DEVICE AND CONSTRUCTION METHODS

(75) Inventors: Lajos Burgyan, Mountain View, CA (US); Marc Davis-Marsh, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 248 days.

(21) Appl. No.: 13/035,067

(22) Filed: Feb. 25, 2011

(65) Prior Publication Data

US 2012/0217614 A1    Aug. 30, 2012

(51) Int. Cl.
*H01L 23/58*    (2006.01)

(52) U.S. Cl.
USPC .... 257/531; 257/659; 257/686; 257/E23.114; 257/E29.325

(58) Field of Classification Search
USPC ................. 257/531, 532, 659, 686, E23.114, 257/E29.325, E21.704; 438/125
See application file for complete search history.

(56) References Cited

U.S. PATENT DOCUMENTS

| | | | | |
|---|---|---|---|---|
| 6,437,409 B2* | 8/2002 | Fujii | | 257/379 |
| 6,611,041 B2* | 8/2003 | Maeda et al. | | 257/531 |
| 7,057,279 B2* | 6/2006 | Ogawa | | 257/728 |
| 7,091,576 B2* | 8/2006 | Yamamoto et al. | | 257/531 |
| 8,039,939 B2* | 10/2011 | Hwang | | 257/680 |
| 8,048,766 B2* | 11/2011 | Joly et al. | | 438/455 |
| 8,273,594 B2* | 9/2012 | Quevy et al. | | 438/50 |
| 2004/0032011 A1* | 2/2004 | Warner et al. | | 257/676 |
| 2008/0315375 A1* | 12/2008 | Eichelberger et al. | | 257/659 |
| 2009/0309185 A1* | 12/2009 | Oka et al. | | 257/531 |
| 2011/0156204 A1* | 6/2011 | Chen et al. | | 257/531 |
| 2011/0304013 A1* | 12/2011 | Chen et al. | | 257/531 |
| 2013/0069197 A1* | 3/2013 | Kim et al. | | 257/531 |

* cited by examiner

*Primary Examiner* — Allan R Wilson
(74) *Attorney, Agent, or Firm* — Andrew S. Viger; Wade J. Brady, III; Frederick J. Telecky, Jr.

(57) ABSTRACT

In one aspect, the present invention relates generally to integrated circuit (IC) packages and more specific to some embodiments of IC power convertor technologies. In particular, IC packages that have a high degree of scalability to handle high voltage or current levels, good heat dissipation properties, flexible adaptability to generate packages operable at a wide range of current levels and having a wide range of power adaptability, lends itself to rapid inexpensive prototyping, the ability to adapt various substrates and IC devices to one another without extensive retooling or custom designing of components, as well as other advantages.

17 Claims, 10 Drawing Sheets

POWER CONVERTOR DEVICE AND CONSTRUCTION METHODS

TECHNICAL FIELD

The present invention relates generally to the packaging of integrated circuits (ICs). More particularly, the present invention relates to the co-packaging of integrated circuits and passives.

BACKGROUND OF THE INVENTION

Portable electronics, such as cell phones, tablet computers, laptops, solid-state data storage devices, portable instruments, and other small computerized devices are becoming increasingly popular. Currently, many portable electronics contain one or more power supplies and power convertors. The need for many power supplies has caused an increasing need for more effective power convertors. Existing power convertors suffer from a myriad of problems. Such problems include large size, inflexible format, problems associated with heat removal, the need to incorporate many customized active and passive components, and the requirement for expensive tooling.

There is a need for a power convertor device that is easily developed and does not require extensive use of customized parts. A package of this sort should have excellent thermal properties and small size. Such packages should be manufactureable, testable, and subject to prototyping, all at a relatively low cost. It will be advantageous if such packages would not require expensive tooling or expensive retooling when small changes are made to the package. Such packaging technologies should be scalable to a wide range of input/output voltages and currents, they should facilitate a wide range of form factors, and provide appropriate and efficient interfaces for heatsink attachment. Also, operability at relatively high switching frequencies is an important objective.

In the current state of the art, not package fabrication methodologies or package designs can capture all of these objectives or even a majority of them. Accordingly, there is a need for improved package design and improved device capability.

An apparatus and method for making semiconductor packages and also semiconductor packages using voltage controllers with inductors, capacitors, and resistors, co-located within them, is therefore needed. Although existing technologies work well for various applications, there are ongoing efforts to improve the performance and reduce the footprint of wireless components.

SUMMARY OF THE INVENTION

In one aspect, the invention comprises an integrated circuit package with a substrate having a raised electrically insulating frame arranged on a surface of the substrate defining chamber within an inner periphery of the frame. A die is coupled with an electrical interconnect structure with both mounted in the chamber and further arranged such that a protective filler encapsulates the chamber and at least a portion of the die. In one implementation the substrate comprises and inductor and the die comprises a semiconductor device having voltage converting circuitry.

In a specific embodiment the frame and inductor are formed of LTCC materials affixed to one another using a LTCC sintering process. In another embodiment the frame and inductor are formed of different materials and are coupled to one another using an adhesive material.

In another aspect, the invention comprises in integrated circuit package comprising an inductor substrate having a raised electrically insulating frame arranged on a surface of the substrate defining chamber within the frame and a voltage control integrated circuit die configured as a voltage convertor configured as high power voltage convertor further including an outer shell configured as an EMI shield that encloses a substantial portion of the package.

In another aspect, the invention defines a method for packaging an integrated circuit. The method includes the operations of attaching an electrically insulating frame structure to a substrate comprising an inductor, thereby defining a chamber within the frame. Also, arranging an electrical interconnect structure such that a portion of the interconnect structure lies inside the chamber and arranging a die such that the die is electrically coupled with the interconnect structure and a portion of the die also lies within the chamber. Also, the operation of sealing portions of the interconnect structure and portions of the die with a filler material to seal the package.

BRIEF DESCRIPTION OF THE DRAWINGS

The invention and the advantages thereof may best be understood by reference to the following description taken in conjunction with the accompanying drawings in which.

In the drawings, like reference numerals are sometimes used to designate like structural elements. It should also be appreciated that the depictions in the figures are diagrammatic and not to scale.

DETAILED DESCRIPTION OF EXAMPLE EMBODIMENTS

In one aspect, the present invention relates generally to integrated circuit (IC) packages having one or more passive components embedded within the package itself, and various modes of fabrication. In one more specific application, the invention is directed to IC power convertor packages, fabrication methodologies, and general technologies. In particular, aspects of the invention concern IC packages that have a high degree of scalability, high power density, good heat dissipation properties, flexible adaptability to generate packages operable at a wide range of current levels and having a wide range of power adaptability and voltage conversion ranges, lend themselves to rapid inexpensive prototyping, demonstrate adaptability of various substrates and IC devices to one another without extensive retooling or need for custom designed components, as well as other advantages.

While this invention has been described in terms of several preferred embodiments, there are alterations, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention. This semiconductor and/or power convertor package involves a number or different types of electrical interconnect structures including lead frames, leadless lead frames, multi-level lead frame structures, dielectric layers and multiple layer dielectrics, and insulating layers. The disclosed packages and power convertors may contain a variety of components including one or more inductor devices, frame structures including, but not limited to, insulated frames, and also integrated circuits, emf shield structures, interconnect layers, heat sinks, conductive vias, passive devices, MEMS devices, sensors, thermal pipes etc. The various components can be arranged and stacked within the packages described herein in a wide variety of different ways. The layers and components of the packages can be processed using various conventional wafer level processing techniques, such as deposition, spin coating, spray coating, lithography and/or electroplating. Moreover the components of the packaged can be subject to etching, laser cutting, cutting in general, and other material removal techniques. Another aspect of the present invention relates to wafer level manufacturing techniques and structures that integrate multiple active and/or passive components into a single, cost-effective, high-performance package. In some implementations an entire wafer scale substrate can be singulated to form individual packages.

Accordingly, the present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known operations have not been described in detail so not to unnecessarily obscure the present invention.

Figure 1A:
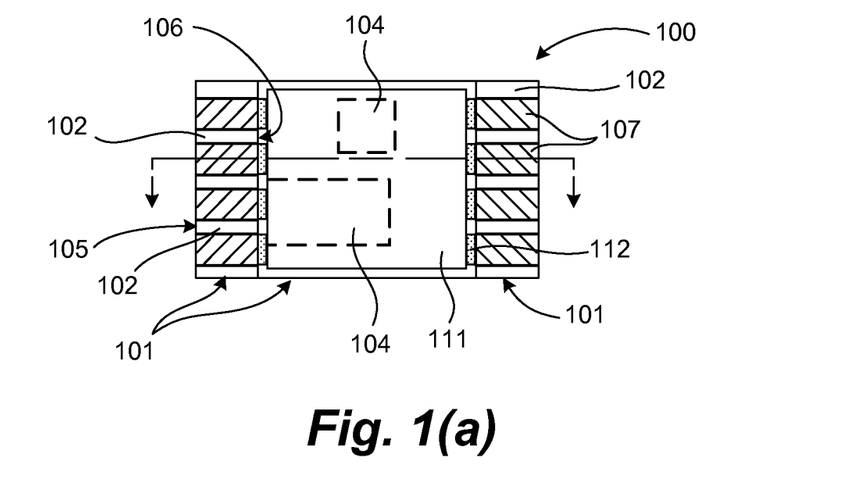
FIGS. 1(a)-1(d) illustrates a diagrammatic cross-section and plan views of a package including a semiconductor die arranged in a recess of a substrate having raised side wall. In particular, one illustrated embodiment a package including a semiconductor die configured as a voltage control system is arranged in a recess of a substrate comprising an inductor having raised side walls in accordance with an embodiment of the present invention
Figure 1B:
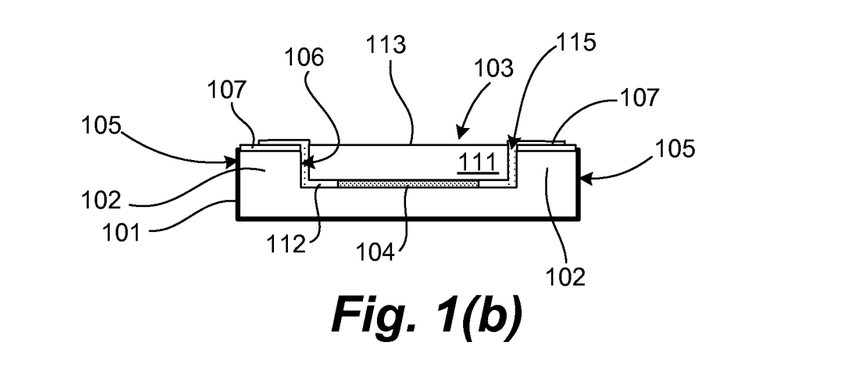
Figure 1C:
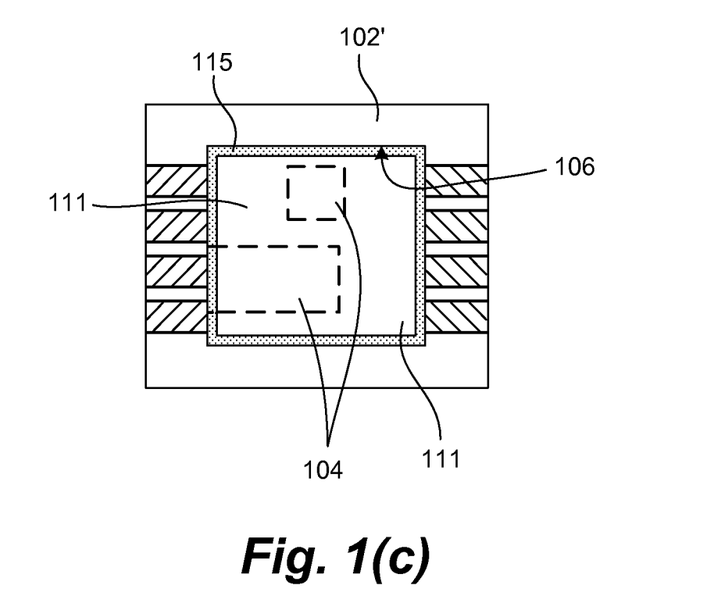

Referring to FIGS. 1(a) & 1(b), an example embodiment of an IC package is illustrated and described. FIG. 1(a) shows a first plan view of package embodiment 100 in accordance with the present invention. In general, the package includes a substrate 101 having a frame 102 mounted thereon to form raised edges 102 such that a recess 103 is defined at a surface of the substrate 101. Into the recess 103 is fitted an electrically conductive interconnect structure 112 and an associated integrated circuit die 111. The die 111 is electrically coupled with the interconnect structure 112 which can also be coupled with electrical contacts 104 of the substrate 101. The package can be sealed with a filler material 115 introduced into the recess 103.

In a particular implementation the substrate 101 comprises an inductor device. The inductor 101 (substrate) comprises a magnetic core portion and a conductive element wrapped around the magnetic core. In one particular embodiment the core comprises a ferrite material with conductive windings added to provide the coil. One particularly advantageous approach uses a ferrite tape to create suitable inductors. Processes for using such tapes to create inductors structures are known to those of ordinary skill In such an implementation, the inductor 101 can include electrical contacts 104 that enable electrical coupling of the die 111 to the inductor 101. Also, when the package 100 is used in a power transformer or power level shifting implementation, the die 111 comprises circuitry enabling control and driving of voltage level shifting circuitry that enables control of the inductor 101 and inductor systems to enable, among other things, voltage control enabling the package 100 to operate at more than one different power level.

It should be specifically pointed out that the die 111 can comprise any of a number of different IC systems and die. In one particular embodiment, the die 111 can be configured as a power convertor. Such convertors can include, but are not limited to a buck convertor, a boost convertor, a single-ended primary-inductor converter (SEPIC), a buck-boost convertor, a flyback convertor, and a Ćuk converter. Class D audio amplifiers, class G convertors, class H convertors, DC-DC convertors (e.g., switched capacitor convertors), are but a few examples. But again, although having excellent suitability to power convertor implementations, the invention has implementations to many other package implementations.

It is specifically pointed out that into the recess 103 more than one die 111 can be mounted and electrically connected with interconnect structures 112, thus several active systems can be mounted in the packages. For example, several different IC's can be mounted in the same recess (or alternatively elsewhere on the substrate). For example, several voltage regulator IC's could be mounted in the same substrate 101. It should also be pointed out that the system can further include one or more passive systems or components.

In this embodiment, the substrate 101 is modified by adding a frame structure 102 to form raised outer walls 102 on a surface of the inductor 101. It should be noted, that such an approach works particularly well with planar inductor surfaces although it need not do so. Here, the frame structure 102 forms raised outer walls on the inductor 101. In one embodiment, the frame 102 formed as a separate component and then affixed to the inductor 101 to generate the raised walls arranged near an outer periphery of the inductor 101. Typically, the frame 102 is formed of an electrically insulating material. Additionally, a surface of the frame 102 can be treated to form a series of electrical contacts 107. For example, as described using this view, a tape having a plurality of contacts 107 can be adhered to a top surface of the frame 102. Although attractive for many embodiments, the contacts 107 are not necessary to practice all embodiments of the invention.

It is to be noted that in this embodiment, electrical contact surfaces of the interconnect structure 112 can be electrically coupled with edge mounted contacts 107 formed on a surface of the frame 102.

Accordingly, the attached frame 102 has an outer periphery 105 that can be generally about the same size as an outer edge of the inductor 101. In other embodiments, the outer periphery can extend further or lie within the bounds of the inductor

101. Additionally, the attached frame 102 has an inner periphery 106 that defines therein a recess 103 into which the electrical interconnect structure 112 and the associated die 111 can be positioned. Typically, the interconnect structure 112 is soldered to the electrical contacts 104 to electrically connect and affix it to the inductor 101. However, it is pointed out that other approaches for electrically connected and affixed the interconnect structure 112 to the inductor 101 can be used. The die 111 is electrically coupled with the interconnect 112. For example, the die 111 can be configured as a ball grid array that is coupled with the interconnect 112 using a reflow process or such other processes as are generally known.

It should be pointed out that in such an implementation a die attach pad (DAP) 113 of the die 111 is arranged so that it faces away from rather than toward the inductor 101. This will enable heat to be dissipated from the die 111 through the die attach pad 113 into a printed circuit board (PCB) or any other mounting structure onto which the package 100 is mounted.

Additionally, in one embodiment, the electrical interconnect structure 112 can comprise a lead frame onto which the die 111 can be mounted to form a unitary die/leadframe assembly. In many embodiments, it can be advantageous to mount this entire assembly onto the substrate together rather than one piece at a time.

In a related embodiment, FIG. 1(*c*) describes a substrate 101 (e.g., an inductor) having a generally rectangular (or square) raised frame structure 102' that is affixed to the inductor similar to the frame 102 described above. In this embodiment, the frame defines and inner periphery 106 that defines therein a recess that circumscribes the outer edge of a die 111 mounted in the recess. As before, the die and electrical connections can be sealed in the package 100 using a filler material 115.

FIG. 1(*d*) is another IC package embodiment, generally analogous to that shown in FIG. 1(*b*) with a dual layer lead frame. Here, the package includes a substrate 101' having raised sidewalls 102' thereby defining the internal recess 103 as described in the earlier embodiments. As before, the interconnect structure 112 and die 111 are mounted within the recess 103. The components are generally interconnected as described above. Importantly, the substrate 101' and 102' are constructed as a single integrated structure comprising the same material. One non-limiting example of such can approach can use an LTCC material to fabricate the entire inductor substrate 102'/103' as a single unit (or array of units). As before, the package can be sealed with a filler material 115 introduced into the recess 103.

Figure 1D:
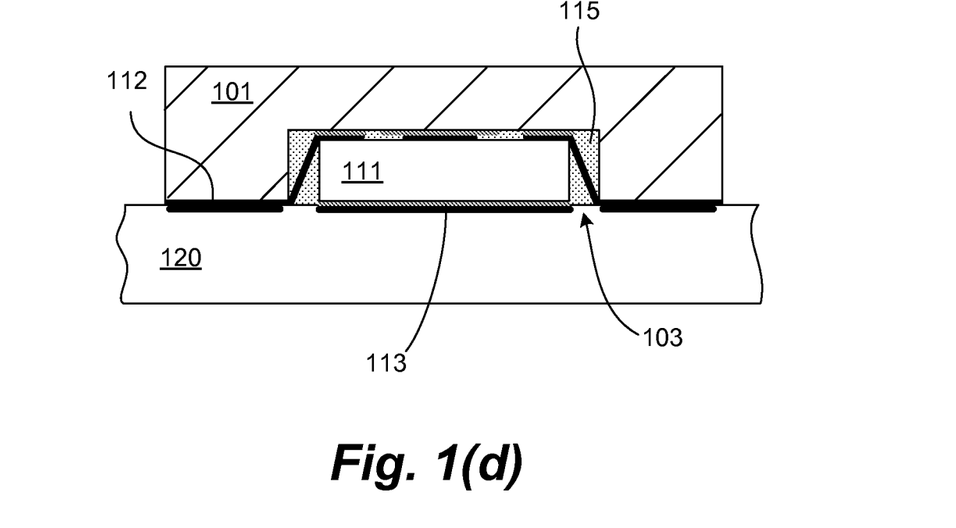

As with the other embodiments of the invention, the package can be mounted to a mounting substrate 120. In one case, the substrate can comprise a PCB, although other mounting substrates are contemplated. As indicated above, the DAP 113 is oriented toward the mounting substrate 120 such that good thermal contact can be maintained between the DAP and the substrate to bleed off heat to the substrate 120.

Figure 2A:
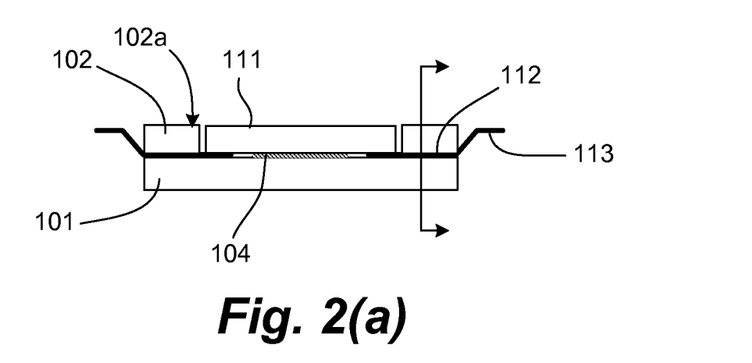
FIGS. 2(a)-2(d) illustrates a diagrammatic cross-section and side views of a package including a semiconductor die configured as a voltage control system is arranged in a recess of a substrate comprising an inductor having raised side walls and a variety of electrical connector embodiments in accordance with an embodiment of the present invention
Figure 2B:
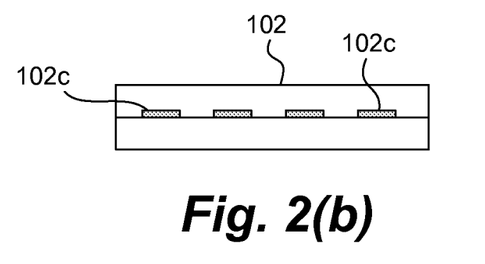

In another related embodiment, such as described with reference to FIGS. 2(*a*) & 2(*b*), a different construction is contemplated. In general, in this embodiment the electrical interconnect structure 112 is arranged between the frame structure 102 and the inductor substrate 101. In this embodiment, the interconnect structure 112 (or an assembled combination of the interconnect structure 112 and the die 111 mounted together) is mounted to the substrate inductor 101 prior to the addition of the raised frame structure 102. The frame 102 is then mounted to form a recess that surrounds the portion of the inductor 101 that holds, or will hold, the die 111. In this configuration, portions of the interconnect structure 112 are sandwiched between the frame 102 and the inductor substrate 101. Leads 113 (comprising a portion of the interconnect structure 112) can extend a distance away from the assembled inductor 101 and frame 102 assembly or have other configurations.

Referring to FIG. 2(*b*), in one embodiment, a set of channels 102*c* can be formed in the frame 102. The channels 102*c* are sized and spaced to enable the leads of the interconnect structure 112 to pass between the frame 102 and the inductor substrate 101. Methods of forming the channels can be varied. For example, the material of the frame can be built up on either side of the channel (e.g., using deposition or other processes) or, for example, material can be removed to form the channel. In one approach, the removal can be facilitated by cutting away material to form the channel, for example laser cutting can be used. Etching could also be used as well as many other techniques. Alternatively, material can be built up on the frame 102 in regions on either side of the channels 102*c* to define the recessed channels sized to accommodate the passing of the leads 113 through the frame 102. Deposition techniques can, for example, be used. In an alternative embodiment, the channels can be absent altogether from the frame and merely be mounted on top of the leads 113.

Figure 2C:
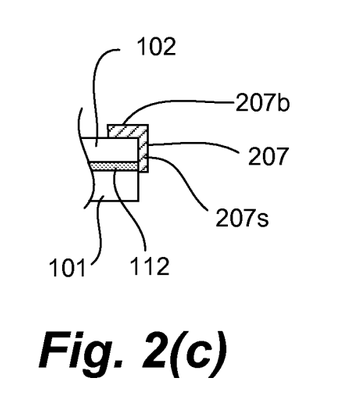

Alternatively, the leads can be made shorter, extending only enough to contact electrical contacts formed on an outer edge portion of the frame 102. FIG. 2(*c*) provides one simplified illustration of this approach. Such outer contacts 207 can formed on an external sidewall 207*s* of the frame 102 and even, in some cases, run along a surface 102*a* of the frame 102 to present an electrical contact surface 207*b* that can be coupled with an attachment contact during mounting of the package to a second substrate (e.g., a PCB, or another device or chip). The end portion of the interconnect structure 112 makes electrical contact with the side wall 207*s* contact surface.

It should also be pointed out that in another related approach, illustrated by way of example in FIG. 2(*d*), a via 102*v* can be formed in the frame 102 and filled with a conductive material 207*v* that enables electrical coupling with a contact surface 207*b*. This contact surface 207*b* can be coupled with a contact of a second substrate during mounting of the package to the second substrate (e.g., a PCB, or another device or chip). A portion of the interconnect structure 112 makes electrical contact with the via 207*v* enabling contact with the surface contact 207*b*.

FIGS. 3(*a*)-3(*i*) illustrate a pair of example fabrication processes that can be used to form different package embodiments. In FIG. 3(*a*), a substrate is provided. In this embodiment, the substrate comprises an inductor 101 having a set of electrical contacts 304. In one embodiment the inductor is formed using ferrite with conductive windings. For example, a ferrite tape can be used to build up a suitable inductor. Example ferrites can include, but are not limited to, $ZnFe_2O_4$ (and other suitable $AB_2O_4$ materials), manganese-zinc (MnZn materials such as $Mn_aZn_{(1-a)}Fe_2O_4$), nickel-zinc (NiZn materials such as $Ni_aZn_{(1-a)}Fe_2O_4$), as well as many others. Particularly useful are materials suitable for low temperature co-fired ceramic (LTCC) processes. One example being ferrite materials, although others can be used. Although these inductors can be fabricated as separate inductors, advantageous embodiments use wafer scale processes where arrays of many inductors are formed on a single large substrate. Typically, the electrically conductive conductor contacts 304 enable electrical connections with the circuitry of the inductor 101.

In FIG. 3(*b*), a frame 102 is provided. Typically, the frame 102 is an electrically insulating material. In one example, the frame 102 comprises an alumina material. However, the inventors contemplate frames formed of any suitable insulating material. The frames can be individually cut to shape. For example, a laser cutting (or other) process can be used to shape the frame. Also, entire sheets of such material can be cut to appropriate dimensions and then affixed to a substrate comprising an array of inductors. In one embodiment, the frame 102 is comprised of a different material than the inductor 101. For example, the inductor 101 can be formed substantially of a ferrite material and the frame 102 is formed substantially of alumina.

Figure 3A:
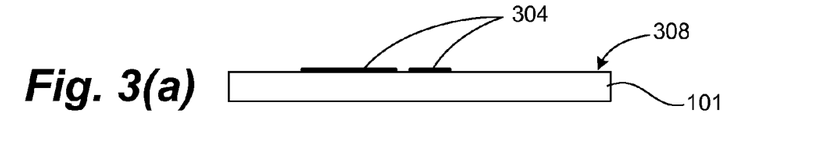
FIGS. 3(a)-3(i) illustrate diagrammatic cross-sectional views of selected steps in various processes used to fabricate voltage convertor packages and semiconductor packages in accordance with the principles of the present invention.
Figure 3B:
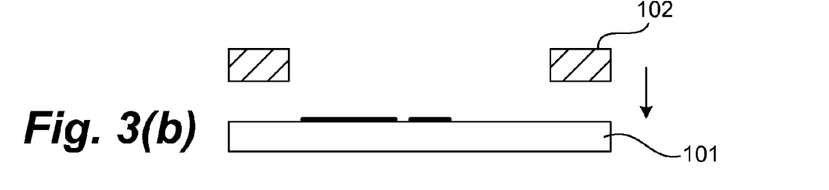
Figure 3C:
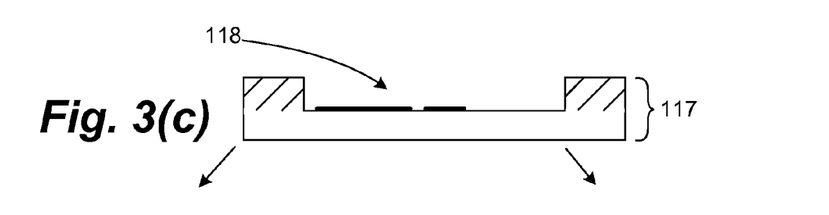

As shown in FIG. 3(c), these materials can be coupled together using any of a number of adhesives to form one embodiment of a frame and substrate assembly 101/102 here generally comprising an inductor support 117 assembly with a suitable recess. One suitable comprises an epoxy material. Generally, a shock resistant, electrically insulating adhesive with good ceramic adhesion properties is well suited for such a purpose. For example, an adhesive such as a high-temperature epoxy suitable to join ceramic surfaces with high strength can be used. The ability to retain joint integrity during thermal cycling is also advantageous feature of such adhesives. It is also advantageous that such epoxies can accommodate materials having different thermal expansion coefficients (CTE). For example, a single-component SUPREME10HTFL polymer system manufactured by Master Bond Inc. can be used, however, there are other manufacturers offering similar products.

In another embodiment, the inductor 101 is formed of a ferrite material or other suitable ceramic suitable as a core and compatible with LTCC processes. In this embodiment, the frame 102 can comprise another (or the same) LTCC material (here a ferrite material, same as the inductor 101). As before the frames can be shaped and cut (e.g., laser cut or other mass cutting process) to size using an entire sheet of frames or as individual frames.

Also, referring to FIG. 3(c), an advantageous aspect to this particular approach, is that the frame 102 can be affixed to the inductor 101 using a LTCC sintering process to form the completed inductor support 117 having a suitably configured recess.

It should be pointed out that in embodiments where the frame electrical contacts (e.g., 107) are used (not shown in this view), they can be attached to the frames 102 as a tape with a set of conductive contacts or formed by deposition processes. Additionally, the contacts 102 can be formed before the frames 102 are attached to the insulators 101 or after assembly, at the discretion of the fabricator or designer.

At this point a number of processes can be used to mount the die 111 with the assembled inductor 101 and the frame 102 (support 117). In a power transformer or power level shifting implementation, the die 111 comprises circuitry enabling control and driving of voltage level shifting circuits. But, as indicated before, the process has applicability to any die and substrate package.

Figure 3D:
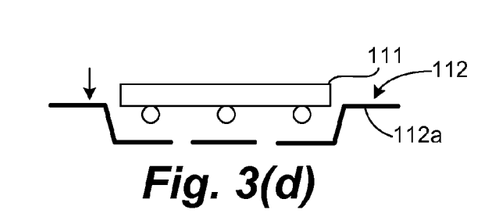

In one approach, referencing FIG. 3(d), the die 111 is coupled with the electrically conductive interconnect structure 112. The interconnect structure can comprise a lead frame 112. Additionally, a die 111 embodiment can be a ball grid array (BGA) type device. It is of course appreciated by those of ordinary skill that a number of other die types and configurations can be employed as well as a range of other interconnect structures. In this implementation the BGA die 111 is coupled with a lead frame 112 to form a unitary die & interconnect structure 113 using any of a number of ordinary attachment processes.

Figures 3E, 3F, 3H:
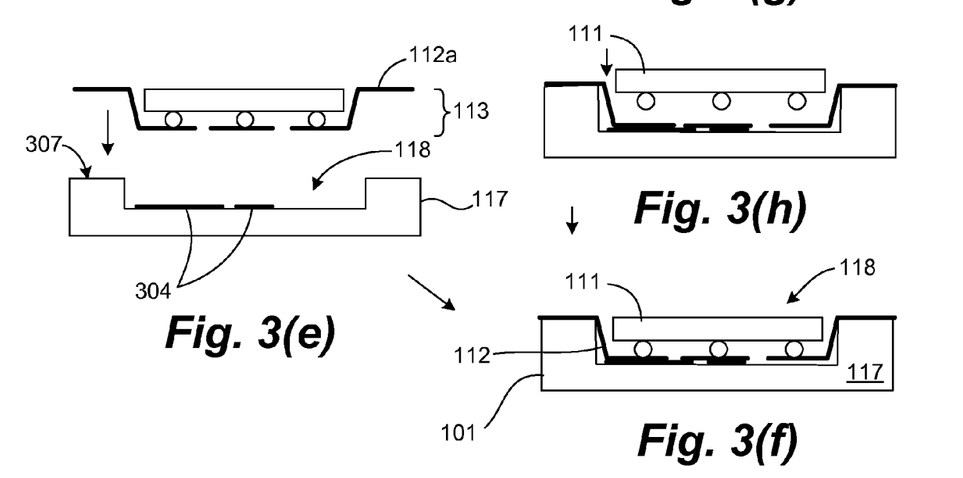

In FIG. 3(e), the completed unitary die & interconnect structure 113 is positioned and secured in place in the recess 118 of the support 117. For example, the unitary die & interconnect assembly 113 can be coupled to the support 117 using a solder process or other processes. In another embodiment, a suitable adhesive can be used.

Figure 2D:
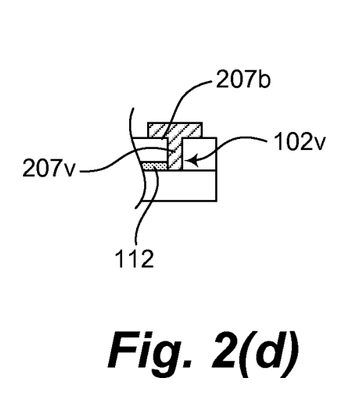

The assembly 113 is typically electrically coupled with the inductor 101 using contacts 304 using, for example, contacts of the interconnect structure 112. In other embodiments, the assembly 113 can be electrically coupled with the inductor 102 using external electrical contacts that couple the die/interconnect assembly 113 with the inductor outside the recess 118. FIGS. 2(c) and 2(d) illustrate some examples of this.

Also, portions 112a of the interconnect structure 112 can be electrically coupled with electrical contacts 307 (for example, analogous to the contacts 107 of FIGS. 1(a) & 1(b)) on the surfaces of the frame portion 102. Coupling with contacts 307 is an optional and convenient added feature, but is not necessary to all embodiments of the invention.

FIG. 3(f) shows a nearly completed package. The die 111 and electrical interconnect structure 112 are secured in place within the recess 118 and electrically coupled with the inductor 101. Typically, the die 111 is arranged with a die attach pad 113 facing away from the inductor 101. Accordingly, when the completed package is mounted on an appropriate circuit structure (e.g., an attachment substrate) heat can be bled away from the package using a thermal transmission path from the die 111 through the die attach pad 113 and into the attachment substrate increasing the overall heat dissipation properties of the package. Additionally, a sealing material (e.g., the filler 115 of FIG. 1(a)) can be introduced to seal the package. Such material can be introduced into the recess 118. In one approach an underfill encapsulant material can be used to seal the package. In one attractive implementation, an electrically insulating, thermally conductive material can be used. In one possible example, a single component epoxy like the Master Bond SUPREME10AOHT is suitable. These are merely example implementations and materials, and thus, are not intended to limit the scope of the inventions or the types of materials.

Figure 3G:
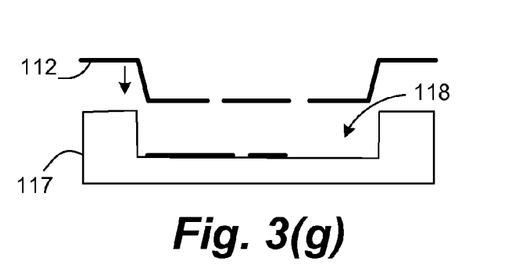

Another slightly different approach can be illustrated with respect to FIGS. 3(g)-3(h). Instead of coupling the die 111 with the electrical interconnect structure 112 and then installing the assembly 113 on the support 117, the components (111, 112) are installed separately. For example, in FIG. 3(g), the interconnect structure 112 is positioned and secured in place in the recess 118 of the support 117. As before, in one embodiment, the interconnect structure 112 can be coupled to the support 117 using a solder process or other coupling processes. As before, adhesives or other approaches can be used.

Then the die 111 is coupled with the installed interconnect 112. In one example, the die 111 can simply be a BGA type that is coupled with the interconnect 112 using a standard reflow type process. The practitioner of ordinary skill is aware that many other attachment modes can be employed. Once the die 111, interconnect 112, and inductor support structure 117 (incorporating inductor 101 and frame walls 102) are secured in place the structure is generally the same as shown in FIG. 3(f) which can be sealed.

Figure 3I:
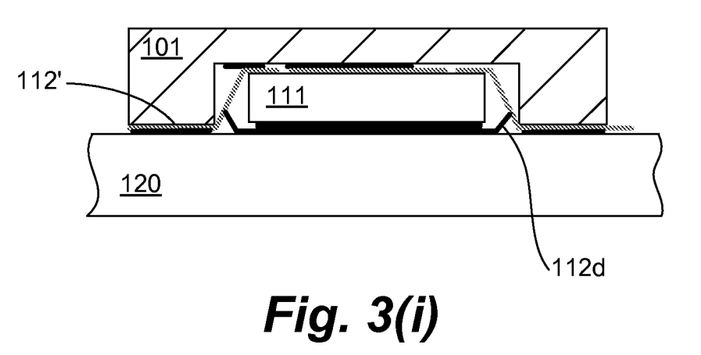

FIG. 3(i) illustrates another package that can be formed using a process analogous to that of FIGS. 3(a)-3(f). In this implementation, the processes illustrated by FIGS. 3(d)-3(e) can be used to form a die 111 having a dual layer interconnect structure 112' which can be mounted with the die 111 and inserted into the recess where it is secured and electrically connected to the inductor 101. In one implementation, this embodiment is particularly useful for the accommodation of multiple semiconductor dies within one package, a scenario often encountered in high-power applications.

This dual layer interconnect/die structure and inductor package can be mounted to a mounting substrate 120 much as described above.

Figure 4A:
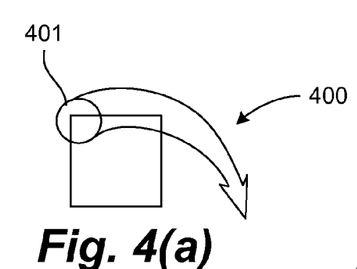
FIGS. 4(a)-4(f) illustrate diagrammatic plan views of selected steps in a fabrication process, used to construct suitable inductor panels that also serve as an inductive element, as well as forming at least partially, the integrated package for a voltage convertor in accordance with the principles of the present invention.

FIGS. 4(a)-4(f) illustrate one example approach of a "wafer scale" fabrication process for creating power convertor packages. FIG. 4(a) is a depiction of one embodiment of a large substrate 400 used to fabricate a large array of inductor devices. One particularly useful approach comprises using large sheets of LTCC materials having conductive materials and patterns arranged on them such that a number of stacked sheets, once subjected to an LTCC processes, form inductor cores and coils arranged to form inductor devices. Typically, such inductors have a substantially planar facing surface onto which further structures can be attached or formed. Reference 401 is used to identify a portion of the larger substrate 400.

Figure 4B:
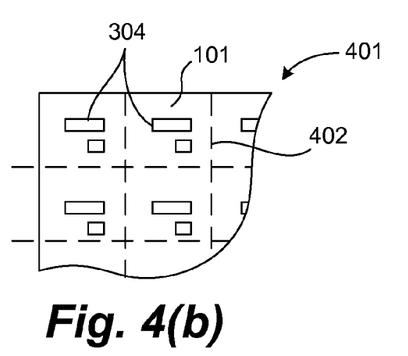

With reference to FIG. 4(b) the large substrate 401 defines a number of device areas 101 (generally analogous to the individual inductor substrates 101 described earlier) delineated by demarcation lines 402 that generally define "saw streets" that will be used in a fabrication process to singulate the large substrate 400 into smaller components (generally individual packages). Further, electrical contacts (such as 304 described earlier) are formed that enable electrical connection with the inductors 101 themselves.

Figure 4C:
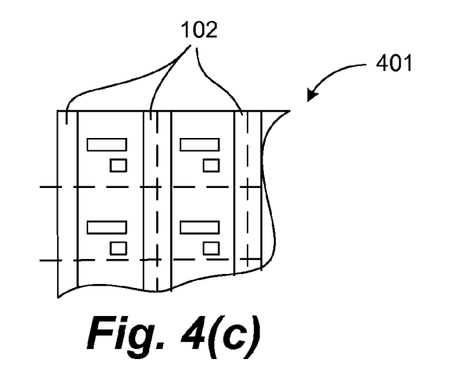

Referring to FIG. 4(c), the raised portions 102 can be formed en masse to cover such portions of the large substrate 400. Modes of fabrication are many. For example, a large wafer sized and patterned carrier (e.g. having an array of preformed LTCC frames 102) can be placed in registry with the inductor substrates 101 and affixed in place. Adhesives can be used to attach the frames 102. Other approaches such as the sintering processes itself, used for the fabrication of LTCC inductor panels, can be utilized to form monolithic inductor structures with integral cavities. Alternatively, deposition processes can be used, as well as other processes known in the art.

It is further pointed out that the shape and size of the raised portions can be varied. For example, frames like 102' of FIG. 1(c) and others can easily be employed in the approach.

Figure 4D:
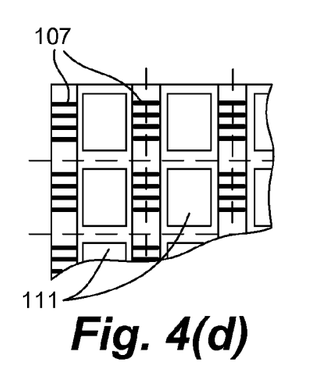

Referring to FIG. 4(d), the appropriate die 111 is attached to the large substrate 400 in the correct position of each inductor 101 (i.e., a package site). Typically the die 111 and interconnect 112 are attached at this stage (although as indicated above, the interconnect structure can be installed prior to the frames 102 in some embodiments). The die 111 can be electrically coupled with the inductors 101 at this time. For example, electrically coupled with the contacts 304. In one particularly advantageous implementation, an array of die can be attached. The processes illustrated with respect to FIGS. 3(a)-3(h) can be used as well as others. Such processes are well suited to the mass attachment of many die in a simultaneous process.

With continued reference to FIG. 4(d), in some embodiments, electrical contact surfaces 107 can be formed on the raised portions 102 of the array. These can also be formed en masse to cover such portions of the large substrate 400. Modes of fabrication are many. For example, a large wafer sized and patterned carrier (e.g. having an array of contacts) can be placed in registry with the inductor substrates 101 and affixed in place. Patterned conductive tapes can be used. Sintering processes could be used with LTCC substrates having electrical contacts formed thereon. Adhesives can be used in other approaches. Deposition processes or others can also be used, as can other processes known in the art.

Figure 4E:
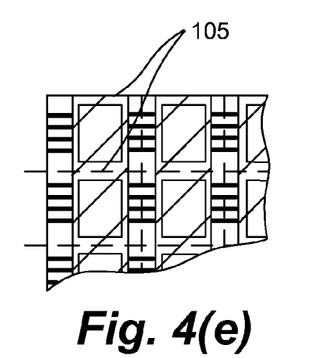
Figure 4F:
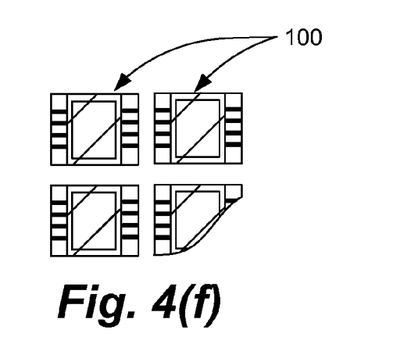

Referring to FIG. 4(e), selected portions of the large substrate 400 can be subjected to an encapsulant fill process where the large substrate 400 is treated with encapsulant materials 105 to seal the dice 111 of the packages. As discussed above, particular encapsulants can include, but are not limited to, thermally conductive encapsulants that are also electrically insulating. As discussed above, many other encapsulants and processes may be employed. As illustrated in FIG. 4(f), this substrate 400, having a multiplicity of packages formed thereon, is then singulated into a plurality of individual packages 100, in this case, each comprising a voltage convertor package.

It is specifically pointed out that although this invention is specifically disclosed as a voltage convertor, the invention is further contemplates an approach enabling a wide range of semiconductor die to be encapsulated on a generally planar surface substrate. For example, this invention is equally suitable to create package-level integrated (embedded) LED lighting solutions.

Figure 5:
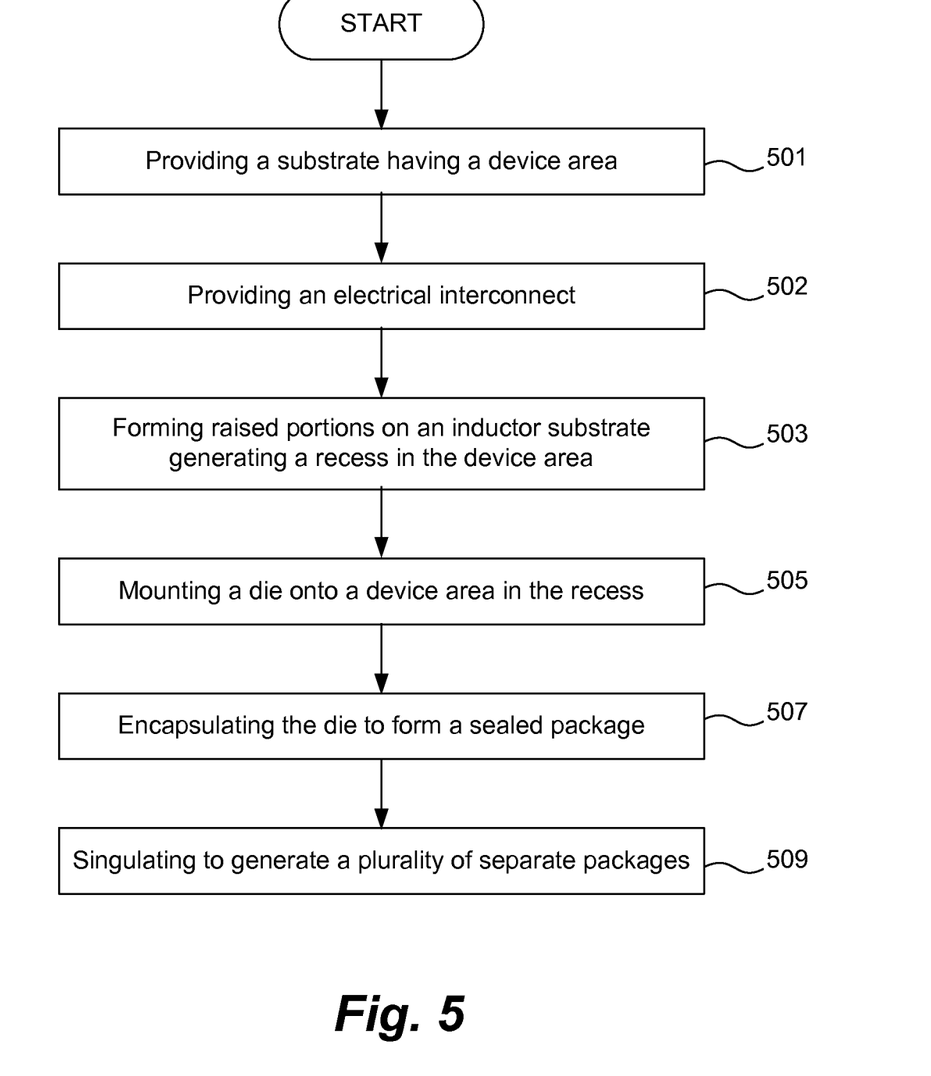
FIG. 5 is a flow diagramming illustrating various operations that can be used to fabricate a semiconductor package in accordance with the principles of the present invention.

In one example process, FIG. 5 illustrates a set of operations can be used to achieve the mass fabrication of voltage control packages. Such a process is generally illustrated with respect to the many drawings of FIGS. 3 and 4. A substrate is provided (Step 501). Generally, this is a wafer scale substrate although other sizes can be used. The substrate can comprise a plurality of device areas. In one particular embodiment, the substrate comprises an inductor substrate having a plurality of inductor devices arranged on the substrate. These inductors can be formed using a number of different fabrication processes. For example, an LTCC fabrication process can be used. Contacts can be formed on the plurality of inductor devices. In some embodiments, the plurality of inductor devices can all include planar facing component surfaces.

Additionally, an electrical interconnect structure suitable for connection with the die is also provided and paired with the die (Step 502). This interconnect can be mounted with the substrate paired either before or after mounting with the die depending on the implementation or process flow employed.

Raised portions can be formed on the plurality of inductor devices (Step 503) using any of a number of methods, including those described herein. The raised portions define recesses for each device area. The die can be mounted onto the device areas (Step 505). This can also be done a number of ways. The die can be mounted as an assembled die and interconnect assembly that is positioned and the attached to the device areas or it can be done as steps of attaching the interconnect structure to the device areas and then attaching the dice onto the interconnect structures already mounted to the device areas. Also, as described above, the operations indicated by Steps 503 and 505 can be reversed in order to fabricate a device package (see, for example, the FIG. 2 series of drawings).

Then, the dice are encapsulated to form sealed packages (Step 507). In a case where a plurality packages are formed on a common substrate, the substrate is singulated to generate a plurality of separate packages (Step 509)

In another approach, the adaptability of the invention enables the construction of high power applications and voltage convertors with relative ease. A process very similar to those illustrated in FIGS. 1-5 can be employed.

Figure 6A:
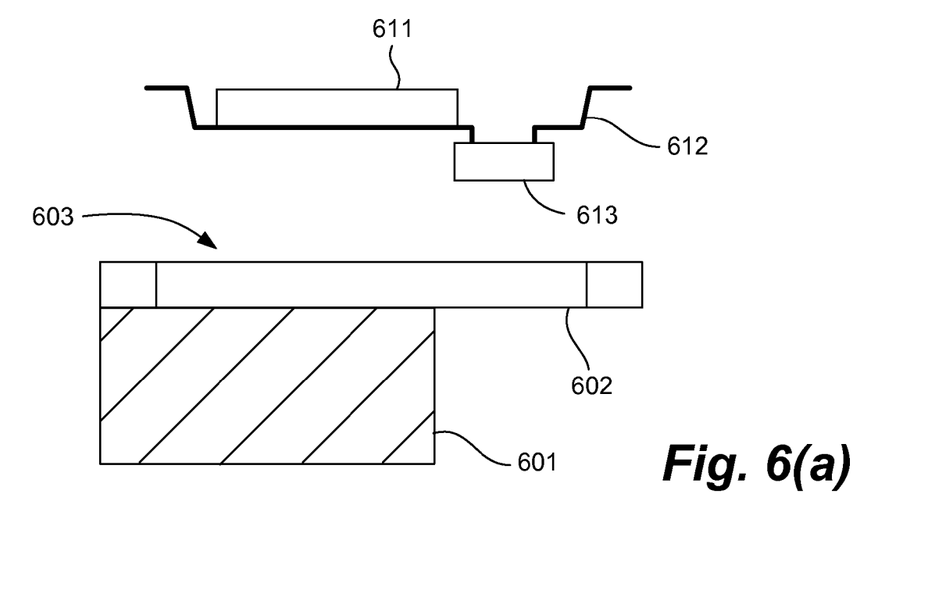
FIGS. 6(a)-6(f) illustrate diagrammatic cross-sectional views of selected steps in various processes used to fabricate selected high, high current convertor packages, containing a polarity of semiconductor devices and passive components.
Figure 6B:
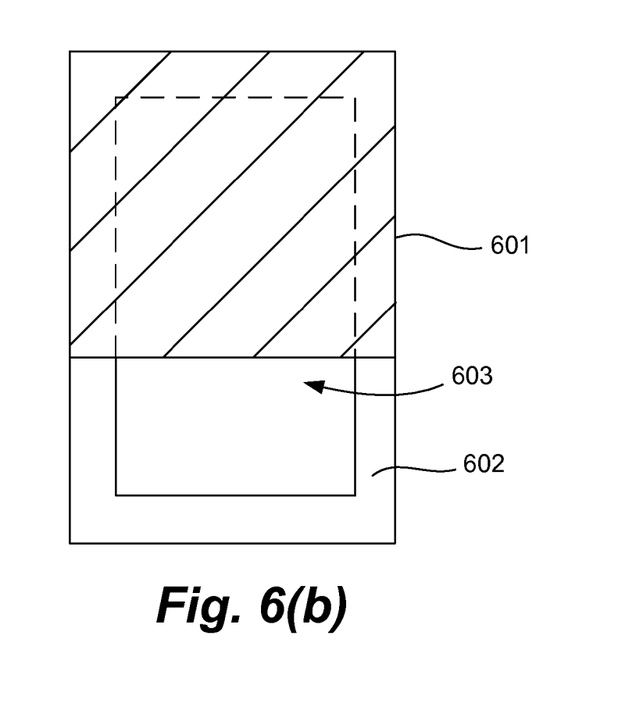

Referring now to FIGS. 6(a)-6(e), an example process is described. FIGS. 6(a) & 6(b), provide a side-sectional and top down views of an inductor having a mounted frame and also a die and interconnect suitable for use. An inductor 601 having the desired properties is provided. For example, providing a high degree of voltage conversion capacity and/or a high current carrying capacity. As with the embodiments above, a size mismatch between inductor and die is not important. In accordance with the invention, no custom made components are required. Only components having the relevant and desired voltage and current properties are needed. An inductor 601 is fitted with a frame 602 that forms a recess 603 sized to support the desired size and type of voltage control circuitry, embodied here as a semiconductor die 611. In this particular illustration, the die 611 is coupled with an electrical interconnect structure 612. Additionally, the die/interconnect assembly 611/612 includes a passive device 613 (e.g., a capacitor or other passive component(s)). Other embodiments can function, as described previously as the die 611 and interconnect 612 as separated components rather than a mated assembly. Also as before, the components can be formed of the same materials as described in the processes illustrated with respect to FIGS. 1-5. In one example and LTCC process can be used to affix the frame 602 to the inductor 601 to form the integrated whole. Where appropriate, adhesive can be employed to affix the frame 602. Other approaches can be used.

Figure 6C:
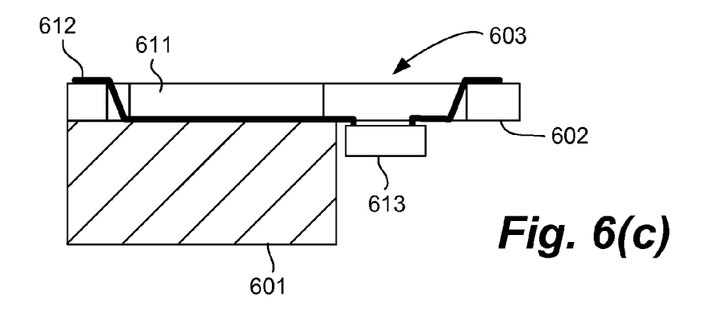
Figure 6D:
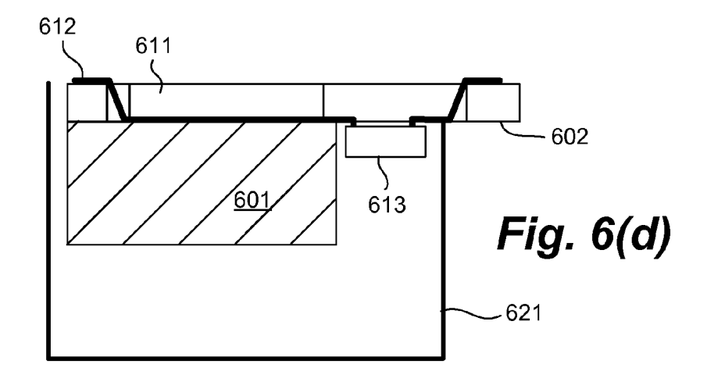
Figure 6E:
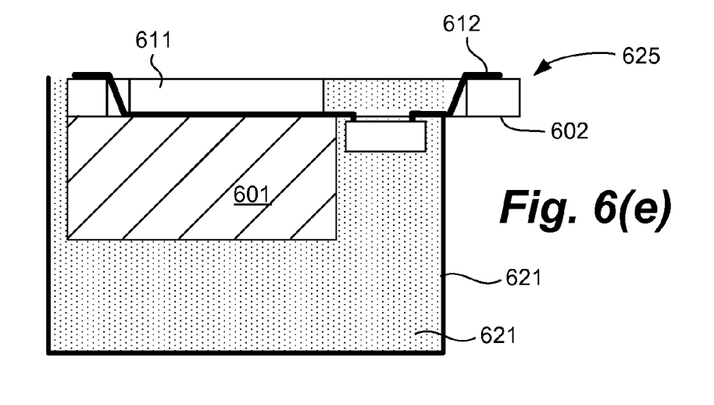
Figure 6F:
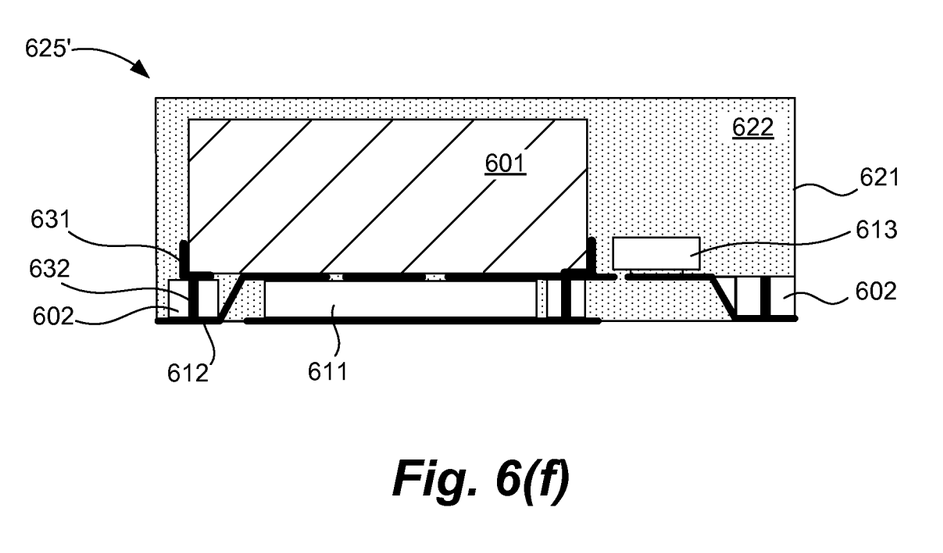

The capacitor 613 can be replaced by a wide range of passive devices including, but not limited to capacitors, resistors, diodes, inductors, as well as other systems. Also, several components can be mounted on the inductor 601. It should be pointed out that such components can form part of any of the embodiments described herein and for the invention generally. In one further example, MEMS devices could be added here as well. In one implementation, the passive device Referring now to FIG. 6(*c*), the die 611 is then inserted into the recess 603 and secured. The prior assembly processes can be used here as well. For example, an electrical interconnect mounting structure 612 can be coupled into the recess as desired. Then the selected die 611 can be coupled with the interconnect structure 612. Of course, the interconnect structure 612 and die 611 can be assembled together in a unitary whole prior to mounting in the recess 603 of the inductor assembly 601/602. Such processes of electrically and physically coupling the die 611, interconnect 612, and inductor 602 have already been described herein.

As touched on above, in some high power implementations, the die 611 is typically mounted with an interconnect 612 having a decoupling capacitor 609. Accordingly, this implementation is very useful in coupling any size die 611 or die and interconnect structure assembly 611/612 to virtually any size inductor assembly 601/602.

Referring now to FIG. 6(*d*), the now combined die and interconnect structure assembly 611/612 and inductor assembly 601/602 is placed inside an EMF (electromagnetic field) shielding container or a "can" 621. This can 621 generally comprises a conductive or metal container. But any structure that operates to substantially shield against EMF propagation is suitable. The idea being that once the chip 611 is inside the can 621, the can operates as shield for the EMF's generated by the package and also shielding the die 611 from EMF from outside the package. It is can be constructed generally as a Faraday cage providing the necessary shielding. The cage 621 operates to prevent high frequency and/or high power signals from inside the package from leaking out and causing difficulties for other nearby systems and also to prevent nearby systems from disrupting operation of the package.

Referring now to FIG. 6(*e*), the assembled package 625 (i.e., the die and interconnect structure assembly 611/612, the inductor assembly 601/602, all positioned within the can 621, is now sealed with an encapsulant 622 that encloses and seals the assembled package. Typically, the encapsulant comprises an electrically insulating and thermally conducting material or other suitable material. This package 625 is very useful in high power, high heat implementations because the package has a large contact area 623 (typically associated with a die attach pad of the die 611) enabling large thermal conductivity to a mounting substrate. This is an important issue as many other prior art devices include a segmented bottom surface that has substantially less conductive surface area. Thus, compared to other prior art packages, the inventive package has excellent thermal properties. As with the other embodiments disclosed herein, this embodiment can be assembled in a wafer scale process as well as an individual process.

FIG. 6(*f*) is another approach that shows how at package such as described herein can also be electrically connected with an inductor element of the type described herein. Referring to the example of FIG. 6(*f*), an assembled package 625' is shown, e.g., the die and interconnect structure assembly 611/612, the inductor assembly 601/602, all positioned within the can 621 that sealed with encapsulant 622 that encloses and seals the assembled package. In this particular implementation one embodiment of electrical connections that interconnect a die 611 with inductor 601 is briefly described. As shown here, one possible mode of connecting a die 611 with an inductor 601 is somewhat similar to the connections described in FIG. 2(*d*). Inductor contacts 631 can be electrically coupled with via contacts 632 that can pass through the raised outer wall portions 602 to contact with the electrical interconnect structure 612. This is but one example of an electrical coupling scheme operable with the embodiments of the invention.

One of the particularly useful attributes of the approaches described herein is that, unlike prior approaches, no customized packaging and components are required. A wide range of inductors can be coupled with a wide range of voltage convertor or other die systems with regard for a need for specialized components. Previously, each die and interconnect had to be mated with a custom designed inductor or vice versa. The cost for making these custom mated components was very high. A single mold to form an inductor may cost $500,000 USD or more. In this approach, an "off the rack" inductor can be readily mated with another "off the rack" voltage control system with great ease. This reduces the prototyping costs and time to virtually nothing compared to prior approaches. Additionally, the adaptability to high power formats and different form factors used to be a massive and expensive problem that is made virtually non-existent with this new technology.

Devices constructed in accordance with the invention can have very small solution sizes. In one non-limiting example, very small voltage convertors on the order 1.2 mm tall and less having package sizes on the order of 15 mm$^2$ or less are achievable. This can substantially cut down the amount of circuit board space taken up by voltage converting circuitry. This advantage alone is significant due to the extreme need for space in modern small sized electronic devices. Additionally, very high power densities are achievable using the devices described herein. The devices have very good heat removal properties by virtue of the possibility of using an entire die attach pad of a chip to dissipate heat into a mounting surface. One example of an inventive device a has Theta JC of about 6° C./W with a Theta JA of about 36° C./W. These are merely examples, with actual devices having a wide range of further properties. Relatively high switching frequencies are also attainable with such packages generally in the range of about 100 kHz to about 10 MHz, with one particular embodiment having a switching frequency of about 3 MHz. The patent further contemplates even higher switching frequencies on upward to about 30 MHz. But as indicated before, this invention lends itself well to scaling up to higher voltages and high currents with a great deal of ease. One demonstration of this feature is illustrated by the example discussed with respect to FIG. 6. And as previously mentioned, this invention is also accompanied by a massive reduction of time and cost used to develop and test prototypes and also takes advantage of reduced costs in ordinary manufacturing.

Although only a few embodiments of the invention have been described in detail, it should be appreciated that the invention may be implemented in many other forms without departing from the spirit or scope of the invention. For example, the various embodiments described herein are sometimes illustrated with distinctive and different features. The present invention, however, contemplates a wide variety of integrated circuit packages that can each contain almost any combination of the features described herein and be formed using almost any combination of the processes described herein.

Therefore, the present embodiments should be considered as illustrative and not restrictive and the invention is not limited to the details given herein, but may be modified within the scope and equivalents of the appended claims.

What is claimed is:

1. A packaged circuit comprising:
   a substrate formed as an inductor;
   an electrically insulating frame structure arranged on a surface of the inductor substrate and defining an outer periphery at an outside portion of the frame and defining a chamber at an inner periphery at an inside portion of the frame, and with a frame attach surface opposite the surface of the inductor substrate and configured for attachment to a mounting structure;
   an integrated circuit die including an interconnect surface and a die attach pad (DAP) surface opposite the interconnect surface and configured for attachment to the mounting structure;
   an electrical interconnect structure including at least a first portion disposed within the chamber and at least a second portion extending outside the chamber;
   wherein the die is disposed in the chamber with the interconnect surface connected to the inductor substrate by the first portion of the electrical interconnect structure, and with the DAP located opposite inductor substrate; and
   a protective filler in the chamber encapsulating the die and at least the first portion of the interconnect structure, and exposing the DAP surface of the die and the frame attach surface for mounting to the mounting structure.

2. A packaged circuit as recited in claim 1, wherein the integrated circuit die comprises voltage converting circuitry.

3. A packaged circuit as recited in claim 2, wherein the electrically insulating frame structure is formed of a different material than the substrate.

4. A packaged circuit as recited in claim 2, wherein the frame structure comprises an electrically insulating material adhered to the substrate.

5. A packaged circuit as recited in claim 2 wherein the package includes a passive component electrically coupled with the die.

6. A packaged circuit as recited in claim 2, wherein the substrate comprises an inductor formed of a low temperature co-fired ceramic (LTCC) material.

7. A packaged circuit as recited in claim 6, wherein the substrate comprises a ferrite material.

8. A packaged circuit as recited in claim 7, wherein the electrically insulating frame structure comprises a ceramic or other insulating material.

9. A packaged circuit as recited in claim 3, wherein the substrate is formed substantially of a ceramic material and the frame stricture is formed substantially of an insulating material having partially metalized surface.

10. A packaged circuit as recited in claim 9, wherein the ceramic material comprises a ferrite material and the insulating material comprises an alumina material.

11. A packaged circuit as recited in claim 2, wherein the voltage converting circuitry enables the package to operate as a voltage convertor comprising at least one of a buck convertor, a boost convertor, a single-ended primary-inductor converter (SEPIC), a buck-boost convertor, a flyback convertor, and a Cuk converter.

12. A packaged circuit as recited in claim 2, wherein the electrical interconnect structure comprises a lead frame having a plurality of leads arranged such that at least a portion of at least one of the leads extends outside of the chamber beyond the outer periphery of the insulating frame structure.

13. A packaged circuit as recited in claim 12, wherein the electrically insulating frame structure is arranged so that at least a portion of at least one of the leads are positioned between the insulating frame structure and the surface of the substrate.

14. A packaged circuit as recited in claim 12, wherein the electrically insulating frame structure has a channel formed on a surface of the insulating frame structure configured to enable at least a segment of a lead to pass through the channel.

15. A packaged circuit as recited in claim 2 wherein the package further comprises,
   an outer shell configured as an EMI shield formed of electrically conducting material and configured to enclose the inductor substrate and at least a portion of the die so that the shell operates to reduce the electro-magnetic interference generated by operation of the integrated circuit die an the inductor;
   the shell leaving exposed for attaching to the mounting structure the DAP surface of the die and the frame attach surface of the frame structure.

16. A packaged circuit as recited in claim 15 wherein the package includes a passive component.

17. A packaged circuit as recited in claim 16 wherein the passive component comprises a decoupling capacitor that is electrically coupled with the die using electrical connections of the lead frame and configured such that the capacitor lies inside the EMI shield.

* * * * *